(12) United States Patent
Mimura et al.

(10) Patent No.: US 9,401,291 B2
(45) Date of Patent: Jul. 26, 2016

(54) COATING APPARATUS

(71) Applicant: Tokyo Electron Limited, Tokyo (JP)

(72) Inventors: Yuji Mimura, Koshi (JP); Tetsuya Maki, Koshi (JP); Shigeto Tsuruta, Koshi (JP); Tatsumi Oonishi, Kumamoto (JP); Daisuke Ikemoto, Kumamoto (JP); Takahiro Masunaga, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/525,502

(22) Filed: Oct. 28, 2014

(65) Prior Publication Data

US 2015/0128858 A1     May 14, 2015

(30) Foreign Application Priority Data

Nov. 13, 2013    (JP) ................................ 2013-235006
May 26, 2014    (JP) ................................ 2014-108415

(51) Int. Cl.
| | |
|---|---|
| *B05B 12/02* | (2006.01) |
| *B05B 1/04* | (2006.01) |
| *B05C 5/02* | (2006.01) |
| *B05C 11/10* | (2006.01) |
| *H01L 21/67* | (2006.01) |

(52) U.S. Cl.
CPC ........ *H01L 21/6715* (2013.01); *B05C 11/1047* (2013.01); *H01L 21/67253* (2013.01); *B05C 5/0254* (2013.01); *B05C 11/1013* (2013.01)

(58) Field of Classification Search
None
See application file for complete search history.

(56) References Cited

U.S. PATENT DOCUMENTS 4,067,291 A * 1/1978 Park ............................. 118/699
4,357,900 A * 11/1982 Buschor ....................... 118/681

FOREIGN PATENT DOCUMENTS

JP          2013-98371 A     5/2013

* cited by examiner

*Primary Examiner* — Dah-Wei D Yuan
*Assistant Examiner* — Jethro M Pence
(74) *Attorney, Agent, or Firm* — Posz Law Group, PLC

(57) ABSTRACT

A coating apparatus includes: a slit nozzle including a retention chamber that retains the coating material; a moving mechanism that moves the slit nozzle; a pressure regulation unit that regulates a pressure inside the retention chamber; and a control unit that controls the moving mechanism and the pressure regulation unit to relatively move the slit nozzle with respect to the substrate while changing the pressure inside the retention chamber toward an atmospheric pressure from a negative pressure, wherein the control unit is configured to control the pressure regulation unit so that a change in the pressure inside the retention chamber in a start zone including a coating start position and an end zone including a coating end position becomes slower than a change in the pressure inside the retention chamber in a middle zone except the start zone and the end zone.

10 Claims, 7 Drawing Sheets

SCANNING DIRECTION

COATING APPARATUS

CROSS REFERENCE TO RELATED APPLICATIONS

This application is based upon and claims the benefit of priority of the prior Japanese Patent Application No. 2013-235006, filed in Japan on Nov. 13, 2013, and the prior Japanese Patent Application No. 2014-108415, filed in Japan on May 26, 2014, the entire contents of which are incorporated herein by reference.

BACKGROUND OF THE INVENTION

1. Field of the Invention

The present invention relates to a coating apparatus.

2. Description of the Related Art

As one technique of applying a coating material to a substrate such as a semiconductor wafer, a glass substrate or the like, a slit coating method is known. The slit coating method is a technique of applying the coating material onto the substrate by scanning a long slit nozzle having a discharge port in a slit shape.

Japanese Laid-open Patent Publication No. 2013-98371 discloses a slit nozzle that includes a retention chamber that retains a coating material and discharges the coating material filled in the retention chamber from a discharge port via a passage in a slit shape.

In the slit nozzle disclosed in the above publication, the liquid level of the coating material retained in the retention chamber lowers with progress of coating, so that the hydraulic head pressure of the coating material acting on the discharge port gradually decreases. When the hydraulic head pressure acting on the discharge port decreases, the amount of the coating material discharged from the discharge port decreases, causing possibility that the film thickness of a coating film to be formed on the substrate becomes non-uniform.

Here, in the technique discussed in the above publication, the liquid level height in the retention chamber is measured, and the pressure inside the retention chamber is linearly increased according to the lowering of the liquid level height so as to keep the discharge amount of the coating material constant.

However, there is room for further improvement in increasing the film thickness uniformity in the technique discussed in the above publication.

SUMMARY OF THE INVENTION

An object of the present invention is to increase the film thickness uniformity.

The present invention is a coating apparatus for applying a coating material to a substrate, including a slit nozzle, a moving mechanism, a pressure regulation unit, and a control unit. The slit nozzle includes a retention chamber that retains the coating material. The moving mechanism relatively moves the slit nozzle with respect to the substrate. The pressure regulation unit regulates a pressure inside the retention chamber The control unit controls the moving mechanism and the pressure regulation unit to relatively move the slit nozzle with respect to the substrate while changing the pressure inside the retention chamber toward an atmospheric pressure from a negative pressure. Further, the control unit is configured to control the pressure regulation unit so that a change in the pressure inside the retention chamber in a start zone including a coating start position and an end zone including a coating end position becomes slower than a change in the pressure inside the retention chamber in a middle zone except the start zone and the end zone.

According to the present invention, the film thickness uniformity can be increased.

DETAILED DESCRIPTION OF THE INVENTION

Hereinafter, an embodiment of a coating apparatus disclosed by this application will be described in detail referring to the accompanying drawings. Note that the present invention is not limited by the embodiment described below.

Figure 1:
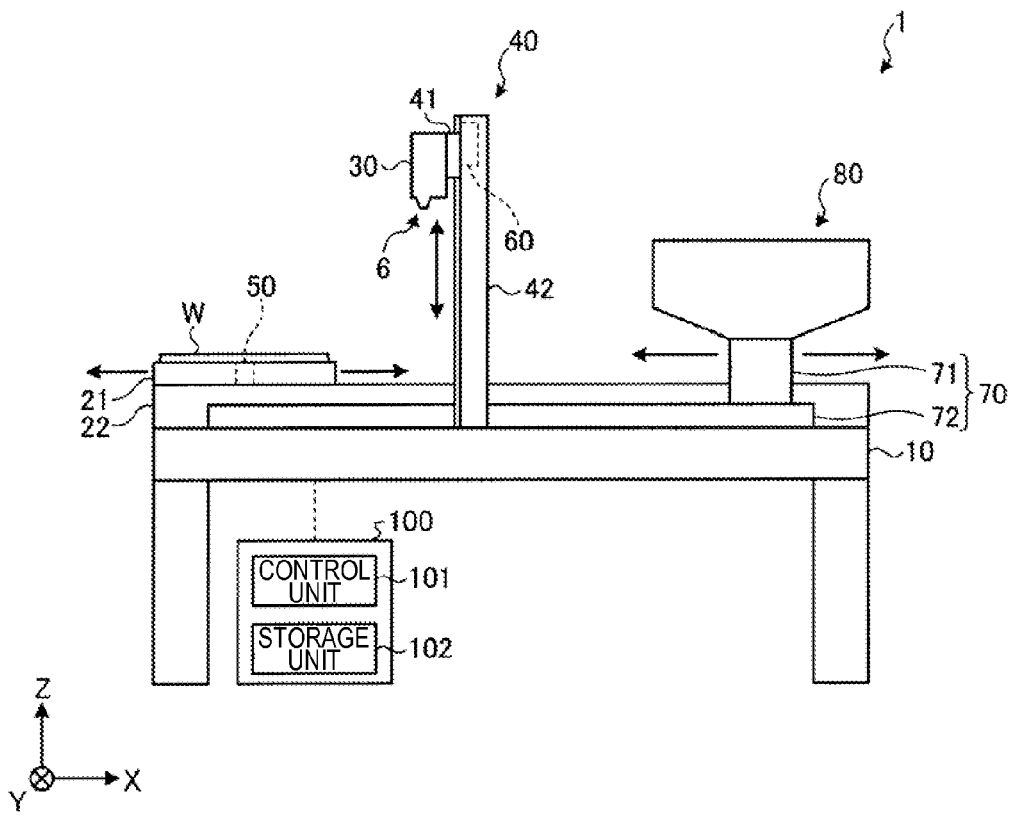
FIG. 1 is a schematic side view illustrating a configuration of a coating apparatus according to this embodiment.

FIG. 1 is a schematic view illustrating a configuration of a coating apparatus according to this embodiment. Note that for clarifying the positional relationship, an X-axis, a Y-axis, and a Z-axis perpendicular to one another are defined, and a Z-axis positive direction is assumed to be a vertical upward direction for clarification of the positional relationship.

As illustrated in FIG. 1, a coating apparatus 1 according to this embodiment includes a mounting table 10, a stage 21, a first moving mechanism 22, a slit nozzle 30, and a raising and lowering mechanism 40.

On the stage 21, a substrate W is mounted. Concretely, the stage 21 has a horizontal upper surface formed with a suction port and horizontally holds the substrate W by attracting the substrate W thereto by suction through the suction port. The stage 21 is disposed at the top of the first moving mechanism 22.

The first moving mechanism 22 is mounted on the mounting table 10 and moves the stage 21 in the horizontal direction (here, an X-axis direction). Thus, the substrate W horizontally held on the stage 21 is horizontally moved.

The slit nozzle 30 is a long nozzle and disposed above the substrate W held on the stage 21. The slit nozzle 30 is attached to the later-described raising and lowering mechanism 40 with its longitudinal direction directed to the horizontal direction (Y-axis direction) perpendicular to the moving direction (X-axis direction) of the stage 21.

The slit nozzle 30 discharges a high-viscosity coating material such as a resist, a sealant, an adhesive or the like from a discharge port 6 in a slit shape formed at its lower portion. The configuration of the slit nozzle 30 will be described later.

The raising and lowering mechanism 40 is a mechanism unit that raises and lowers the slit nozzle 30 in the vertical direction (Z-axis direction), and mounted on the mounting table 10. The raising and lowering mechanism 40 includes a fixing unit 41 to which the slit nozzle 30 is fixed, and a drive unit 42 that moves the fixing unit 41 in the vertical direction (Z-axis direction).

The coating apparatus 1 includes a nozzle height measurement unit 50, a thickness measurement unit 60, a second moving mechanism 70, a nozzle waiting unit 80, and a control apparatus 100.

The nozzle height measurement unit 50 is a measurement unit that measures the distance from a predetermined measurement position to the lower surface of the slit nozzle 30. The nozzle height measurement unit 50 is embedded, for example, in the stage 21.

The thickness measurement unit 60 is a measurement unit that is disposed above the substrate W on the state 21 and measures the distance to the upper surface of the substrate W. The thickness measurement unit 60 is attached, for example, to the raising and lowering mechanism 40. Note that the coating apparatus 1 uses the thickness measurement unit 60 to perform processing of measuring the distance from the measurement position of the thickness measurement unit 60 to the upper surface of the stage 21, and the distance from the measurement position of the thickness measurement unit 60 to the upper surface of the substrate W mounted on the stage 21.

Measurement results by the nozzle height measurement unit 50 and the thickness measurement unit 60 are sent to the later-described control apparatus 100 and used for deciding the height of the slit nozzle 30, for example, at the coating treatment.

The second moving mechanism 70 moves the nozzle waiting unit 80 in the horizontal direction. The second moving mechanism 70 includes a support unit 71 and a drive unit 72. The support unit 71 horizontally supports the nozzle waiting unit 80. The drive unit 72 is mounted on the mounting table 10 and moves the support unit 71 in the horizontal direction.

The nozzle waiting unit 80 is a place where the slit nozzle 30 finished a coating operation waits until the next coating operation is started. In the nozzle waiting unit 80, replenishing processing of replenishing the slit nozzle 30 with the coating material, and priming processing of priming the state of the discharge port by wiping away the coating material adhering to the discharge port of the slit nozzle 30.

The control apparatus 100 is an apparatus that controls the operation of the coating apparatus 1. The control apparatus 100 is, for example, a computer and includes a control unit 101 and a storage unit 102. The storage unit 102 stores a program that controls various processing and treatments such as the coating treatment. The control unit 101 controls the operation of the coating apparatus 1 by reading and executing the program stored in the storage unit 102.

Note that the program may be the one that is stored, for example, in a computer-readable recording medium and installed from the recording medium to the storage unit 102 of the control apparatus 100. Examples of the computer-readable recording medium include a hard disk (HD), a flexible disk (FD), a compact disk (CD), a magneto-optical disk (MO), and a memory card.

Figure 2:
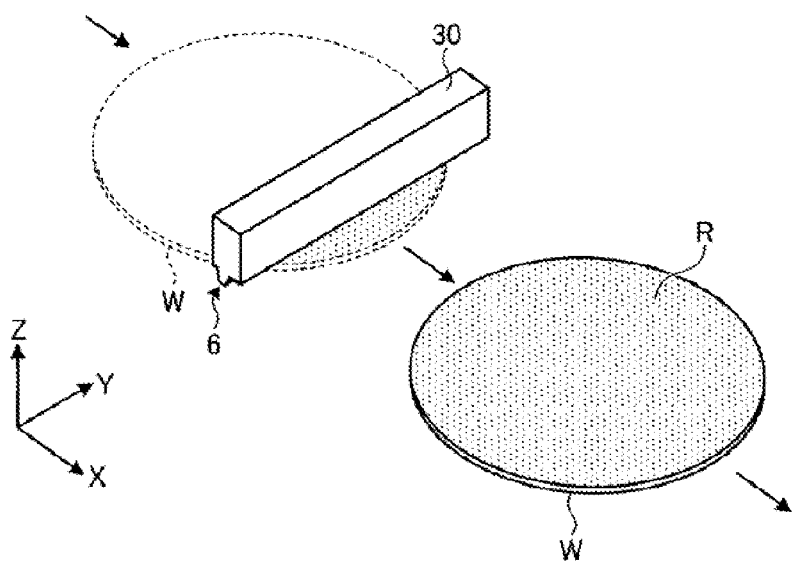
FIG. 2 is a schematic explanatory view of a coating treatment.

Next, the outline of the coating treatment performed by the coating apparatus 1 will be described using FIG. 2. FIG. 2 is a schematic explanatory view of the coating treatment.

As illustrated in FIG. 2, first, the coating apparatus 1 slightly exposes a coating material R from the discharge port 6 in a slit shape formed in the slit nozzle 30 and forms a bead (solution droplet) of the coating material R at the discharge port 6. The coating apparatus 1 then lowers the slit nozzle 30 using the raising and lowering mechanism 40 (see FIG. 1) and brings the bead of the coating material R formed at the discharge port 6 into contact with the upper surface of the substrate W.

The coating apparatus 1 then horizontally moves the substrate W mounted on the stage 21 using the first moving mechanism 22 (see FIG. 1) in the direction (here, the X-axis positive direction) perpendicular to the longitudinal direction of the discharge port 6. Thus, the coating material R inside the slit nozzle 30 is drawn from the discharge port 6 with the movement of the substrate W, and the coating material R is applied and spread over the entire surface of the substrate W.

As described above, the coating apparatus 1 brings the coating material R exposed from the discharge port 6 of the slit nozzle 30 into contact with the substrate W and horizontally moves the substrate W in this state, and thereby applies and spreads the coating material R over the substrate W so as to form a coating film.

Figure 3:
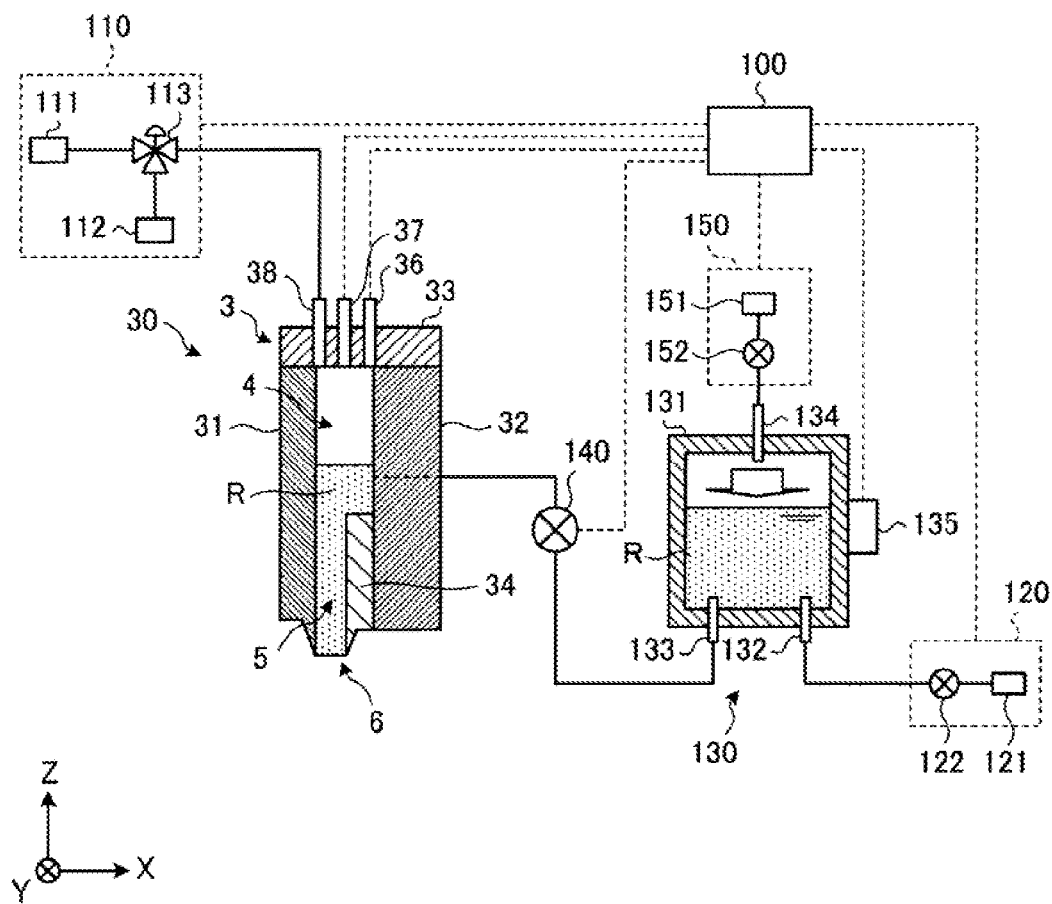
FIG. 3 is a schematic view illustrating a configuration of a slit nozzle.

Next, the concrete configuration of the slit nozzle 30 will be described referring to FIG. 3. FIG. 3 is a schematic view illustrating the configuration of the slit nozzle 30.

As illustrated in FIG. 3, the slit nozzle 30 includes a main body part 3 in a long shape, a retention chamber 4 that retains the coating material R inside the main body part 3, and the discharge port 6 in a slit shape that discharges the coating material R to be fed from the retention chamber 4 via a flow path 5 in a slit shape.

The main body part 3 of the slit nozzle 30 includes a first wall part 31 forming a front surface portion, a second wall part 32 forming a back surface portion and both side surface portions of the slit nozzle 30, a lid part 33 forming a ceiling portion, and a land part 34 in a long shape disposed on a surface opposite to the first wall part 31 of the second wall part 32.

The first wall part 31, the second wall part 32, the lid part 33, and the land part 34 form an inner space of the slit nozzle 30. Of the inner space, a space which is formed by the first wall part 31 and the second wall part 32 is the retention chamber 4, and a space which is formed by the first wall part 31 and the land part 34 and narrower in width than the retention chamber 4 is the flow path 5. The width of the flow path 5 is constant, and the width of the discharge port 6 formed at the tip of the flow path 5 is the same as that of the flow path 5.

The width of the flow path 5 is set to a value so that the surface tension of the coating material R is smaller than the gravity acting on the coating material R in a state where the pressure inside the retention chamber 4 is made equal to the pressure outside the retention chamber 4 and the coating material R drips from the discharge port 6 at a predetermined flow rate. Concretely, the width of the flow path 5 is found in a test performed beforehand by changing the width of the flow path 5, the viscosity of the coating material R, and the material of the slit nozzle 30 and evaluating the state of the coating material R in that case.

In the lid part 33, a liquid level height measurement unit 36, a pressure measurement unit 37, and a pressure regulation pipe 38 are provided penetrating the lid part 33.

The liquid level height measurement unit 36 measures the liquid level height of the coating material R retained in the retention chamber 4. The pressure measurement unit 37 measures the pressure of an enclosed space surrounded by an internal wall surface of the retention chamber 4 and a liquid surface of the coating material R. The pressure regulation pipe 38 is connected to a pressure regulation unit 110 that regulates the pressure of the enclosed space. The liquid level height measurement unit 36 and the pressure measurement unit 37 are electrically connected to the control apparatus 100 so that the measurement result is inputted to the control apparatus 100.

Note that the pressure measurement unit 37 and the pressure regulation pipe 38 may have any arrangements as long as they are communicated with the enclosed space inside the retention chamber 4, and may be provided, for example, penetrating the first wall part 31 and the second wall part 32. Further, the form and arrangement of the liquid level height measurement unit 36 can be arbitrarily selected as long as it can measure the liquid level height of the coating material R. Note that as the liquid level height measurement unit 36, for example, an ultrasonic sensor, a capacitance sensor and the like can be used in addition to an imaging device such as a CCD (Charge Coupled Device) camera.

The pressure regulation unit 110 has a configuration that an exhaust part 111 such as a vacuum pump and a gas supply source 112 that supplies gas such as $N_2$ are connected to the pressure regulation pipe 38 via a switching valve 113. The pressure regulation unit 110 is also electrically connected to the control apparatus 100, and adjusts the opening degree of the switching valve 113 by a command from the control apparatus 100 to connect either the exhaust part 111 or the gas supply source 112 to the pressure regulation pipe 38 so as to be able to regulate the exhaust rate from the inside of the retention chamber 4 and regulate the amount of the gas to be supplied into the retention chamber 4. Thus, the coating apparatus 1 can perform regulation so that the measurement result of the pressure measurement unit 37, namely, the pressure inside the retention chamber 4 takes a predetermined value.

For example, the pressure regulation unit 110 evacuates gas from the inside of the retention chamber 4 to make the pressure inside the retention chamber 4 lower than the pressure outside the retention chamber 4 to thereby draw upward the coating material R inside the retention chamber 4, thus making it possible to prevent the coating material R from dripping from the discharge port 6. Further, supplying gas into the retention chamber 4 makes it possible to pressurize the coating material R remaining inside the retention chamber 4 after application of the coating material R to push out or purge the coating material R.

Note that the configuration of the pressure regulation unit 110 is not limited to this embodiment, but may be arbitrarily set as long as it can control the pressure inside the retention chamber 4. For example, the pressure regulation pipe 38 and a pressure regulation valve may be provided for each of the exhaust part 111 and the gas supply source 112 and individually connected to the lid part 33.

Further, as illustrated in FIG. 3, to the slit nozzle 30, a coating material supply system including a coating material supply unit 120, an intermediate tank 130, a supply pump 140, and a pressurization unit 150 is connected.

The coating material supply unit 120 includes a coating material supply source 121 and a valve 122. The coating material supply source 121 is connected to the intermediate tank 130 via the valve 122 and supplies the coating material R to the intermediate tank 130. The coating material supply unit 120 is electrically connected to the control apparatus 100 so that opening and closing of the valve 122 is controlled by the control apparatus 100.

The intermediate tank 130 is a tank intervening between the coating material supply unit 120 and the slit nozzle 30. The intermediate tank 130 includes a tank unit 131, a first supply pipe 132, a second supply pipe 133, a third supply pipe 134, and a liquid level sensor 135.

The tank unit 131 retains the coating material R. At a bottom portion of the tank unit 131, the first supply pipe 132 and the second supply pipe 133 are provided. The first supply pipe 132 is connected to the coating material supply source 121 via the valve 122. The second supply pipe 133 is connected to the slit nozzle 30 via the supply pump 140.

To the third supply pipe 134, the pressurization unit 150 is connected. The pressurization unit 150 includes a gas supply source 151 that supplies gas such as $N_2$ and a valve 152, and pressurizes the inside of the tank unit 131 by supplying the gas into the tank unit 131. The pressurization unit 150 is electrically connected to the control apparatus 100 so that opening and closing of the valve 152 is controlled by the control apparatus 100.

The liquid level sensor 135 is a sensing unit that senses the liquid level of the coating material R retained in the tank unit 131. The liquid level sensor 135 is electrically connected to the control apparatus 100 so that the sensed result is inputted into the control apparatus 100.

The supply pump 140 is provided at a middle of the second supply pipe 133 and supplies the slit nozzle 30 with the coating material R supplied thereto from the intermediate tank 130. The supply pump 140 is electrically connected to the control apparatus 100 so that the supply rate of the coating material R to the slit nozzle 30 is controlled by the control apparatus 100.

The coating apparatus 1 operates the supply pump 140 to replenish the retention chamber 4 of the slit nozzle 30 with the coating material R from the intermediate tank 130. In this event, the pressure inside the retention chamber 4 is regulated to a negative pressure by the pressure regulation unit 110. Then, the coating apparatus 1 replenishes the retention chamber 4 with the coating material R while gradually lowering the pressure (namely, increasing the degree of vacuum) inside the retention chamber 4 that has been regulated to the negative pressure. In this event, sealing the discharge port 6 of the slit nozzle 30 with a not-illustrated sealing portion makes it possible to prevent the coating material R from leaking out of the discharge port 6 during the replenishing processing.

Further, in the coating apparatus 1, the pressure regulation unit 110 is controlled to bring the inside of the retention chamber 4 to a negative pressure, and supplies the coating material R to the inside of the retention chamber 4 while gradually lowering the pressure inside the retention chamber 4 that has been brought to the negative pressure, thereby more surely preventing the leakage of the coating material R.

In other words, when the liquid level of the coating material R rises due to supply of the coating material R to the retention chamber 4, the hydraulic head pressure increases due to the coating material R acting on the discharge port 6. Assuming that the pressure inside the retention chamber 4 and the pressure outside the retention chamber 4 do not change but are constant during the supply, the force of pressing upward the coating material R relatively weakens by the increase in hydraulic head pressure, causing the possibility of the coating material R leaking out of the discharge port 6 sealed with the sealing portion.

In contrast, in the coating apparatus 1, the pressure regulation unit 110 gradually lowers the pressure inside the retention chamber 4 in conjunction of the rise in liquid level height of the coating material R inside the retention chamber 4, thereby making it possible to supplement the force of pressing upward the coating material R. Thus, it is possible to more surely prevent the coating material R from leaking out of the discharge port 6 sealed with the sealing portion during the processing of replenishing with the coating material R.

Figure 4:
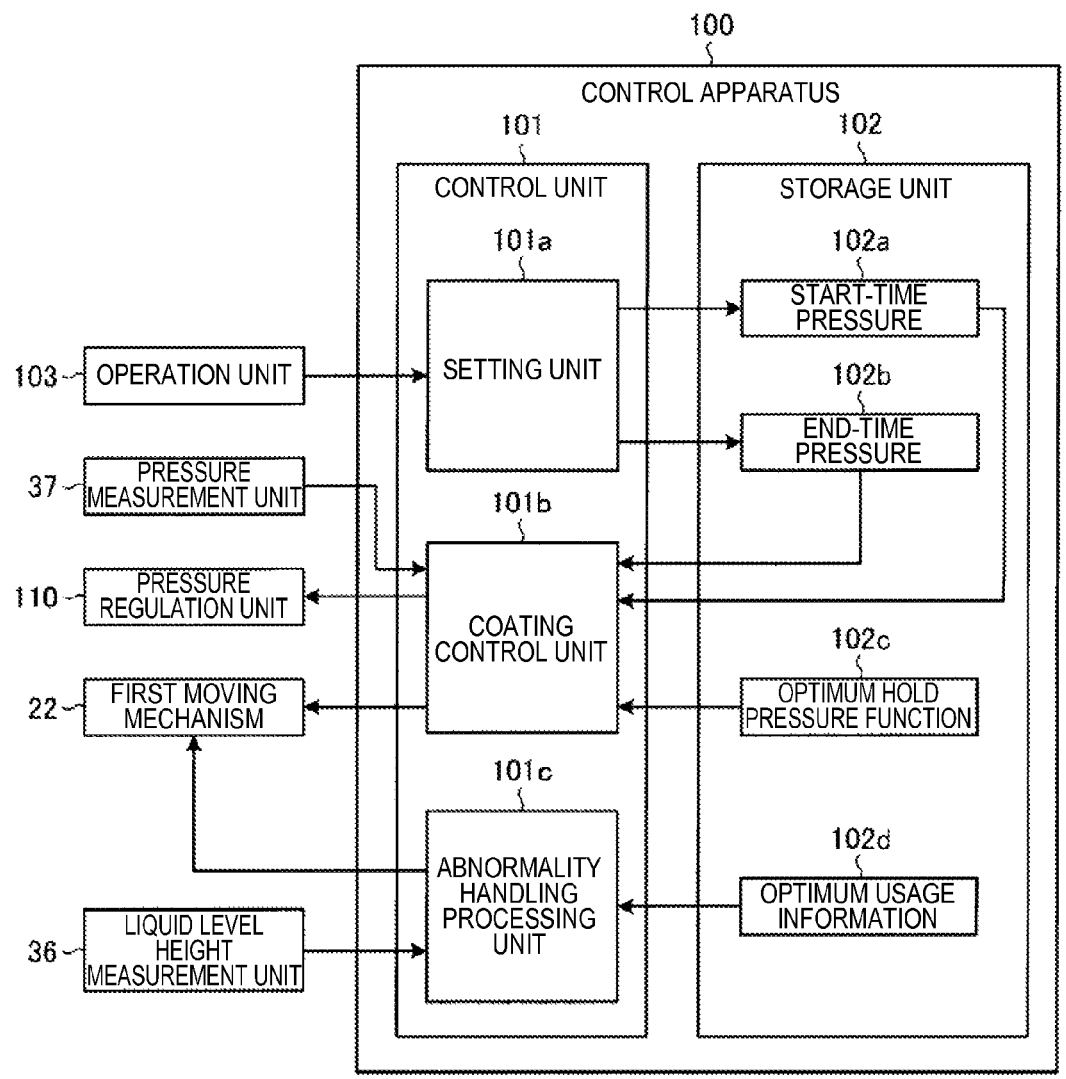
FIG. 4 is a block diagram illustrating a configuration of a control apparatus.

Next, the configuration of the control apparatus 100 will be concretely described referring to FIG. 4. FIG. 4 is a block diagram illustrating a configuration of the control apparatus 100. Note that FIG. 4 illustrates only components required for explaining the characteristics of the control apparatus 100 with description of general components omitted.

As illustrated in FIG. 4, the control unit 101 included in the control apparatus 100 has a setting unit 101*a*, a coating control unit 101*b*, and an abnormality handling processing unit 101*c*. Further, the storage unit 102 included in the control apparatus 100 stores a start-time pressure 102*a*, an end-time pressure 102*b*, an optimum hold pressure function 102*c*, and optimum usage information 102*d*.

The setting unit 101*a* acquires input information by an operator or the like through an operation unit 103 such as a keyboard, touch panel or the like. More specifically, the setting unit 101*a* acquires the start-time pressure 102*a* and the end-time pressure 102*b* through the operation unit 103. The start-time pressure 102*a* is a set pressure inside the retention chamber 4 at a coating start position, and the end-time pressure 102*b* is a set pressure inside the retention chamber 4 at a coating end position.

The setting unit 101*a* also performs processing of storing, into the storage unit 102, the start-time pressure 102*a* and the end-time pressure 102*b* acquired through the operation unit 103.

The coating control unit 101*b* controls the first moving mechanism 22 and the pressure regulation unit 110 to relatively move the slit nozzle 30 with respect to the substrate W while changing the pressure inside the retention chamber 4 toward the atmospheric pressure from a negative pressure.

The coating control unit 101*b* first controls the pressure regulation unit 110 to regulate the pressure inside the retention chamber 4 to a negative pressure. The negative pressure here means a pressure state that the pressure inside the retention chamber 4 is lower than the atmospheric pressure. Regulating the pressure inside the retention chamber 4 to the negative pressure makes it possible to prevent the coating material R from leaking out of the discharge port 6.

The coating control unit 101*b* then controls the first moving mechanism 22 to scan the slit nozzle 30 with respect to the substrate W while gradually lowering the pressure inside the retention chamber 4 that has been regulated to the negative pressure, namely, changing the pressure inside the retention chamber 4 toward the atmospheric pressure.

The coating control unit 101*b* according to this embodiment controls the pressure regulation unit 110 so that the change in the pressure inside the retention chamber 4 in the entire zone from the coating start position to the coating end position becomes a change along an S-shaped curve linking the start-time pressure 102*a* and the end-time pressure 102*b* set by the setting unit 101*a*.

Figure 5:
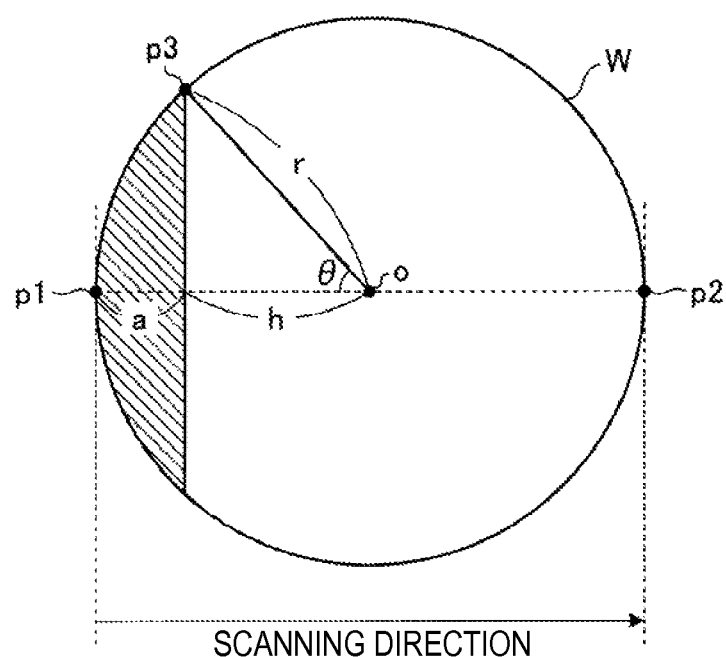
FIG. 5 is an explanatory view of a coated area.
Figure 6:
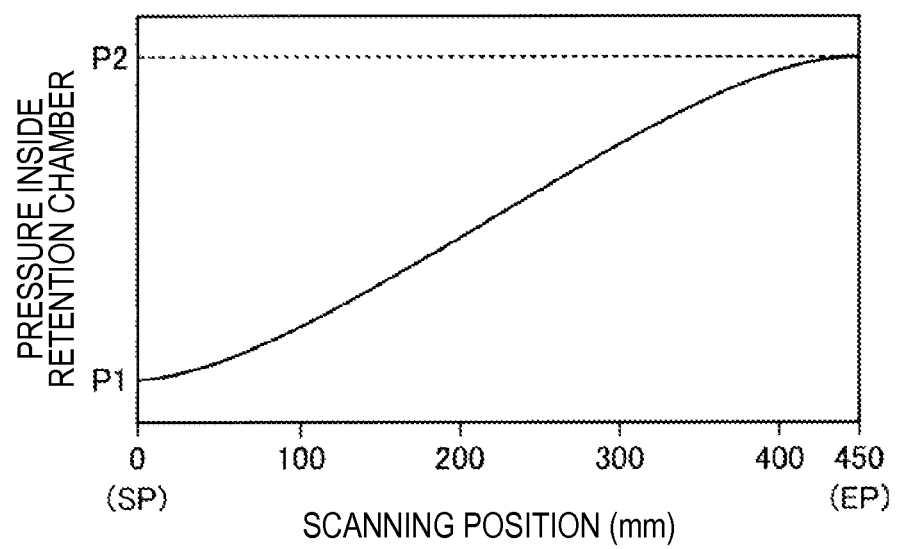
FIG. 6 is a chart illustrating the relationship between a scanning position and a pressure inside a retention chamber.

Hereinafter, this point will be described referring to FIG. 5 and FIG. 6. FIG. 5 is an explanatory view of a coated area. FIG. 6 is a chart illustrating the relationship between the scanning position and the pressure inside the retention chamber 4. The vertical axis of the graph illustrated in FIG. 6 indicates the negative pressure. Note that an example where the diameter of the substrate W is 450 mm is illustrated below, but the diameter of the substrate W is not limited to 450 mm.

In the slit nozzle 30, the liquid level of the coating material R retained in the retention chamber 4 lowers with progress of the coating and the hydraulic head pressure of the coating material R acting on the discharge port 6 decreases. When the hydraulic head pressure decreases, the amount of the coating material R discharged from the discharge port 6 also decreases, causing possibility that the film thickness of the coating film to be formed on the substrate W becomes non-uniform.

Here, since the substrate W is in a disk shape, the increasing rate in the area of the plane coated with the coating material R (hereinafter, expressed as a "coated area") of the plane of the substrate W is not linear.

The decreasing rate of the coating material R in the retention chamber 4 ideally follows the change in the coated area. Therefore, it is possible to keep the pressure inside the retention chamber 4 during the coating treatment at an optimum pressure by performing pressure control according to the proportion of the coated area.

Hence, the coating control unit 101*b* according to this embodiment fixes the start-time pressure 102*a* and the end-time pressure 102*b* and controls the pressure difference between them according to the proportion of the coated area in the surface area of the substrate W.

As illustrated in FIG. 5, it is assumed that the coating start position on the substrate W is p1, the coating end position is p2, and a current scanning position is p3. Further, a moving distance of the slit nozzle 30 from the coating start position p1 is a, the radius of the substrate W is r, a value obtained by subtracting the moving distance a from the radius r is h, and an angle formed between the coating start position p1 and the current scanning position p3 using a central portion o of the substrate W as an origin is θ.

Then, when a≤r, θ=a cos(h/r), so that a coated area S becomes S=(θ−(cos θ)(sin θ))r².

On the other hand, when r<a, θ=a cos((a−r)/r), so that the coated area S becomes S=2πr²−(θ−(cos θ)(sin θ))r².

Assuming that the start-time pressure 102*a* is P1 and the end-time pressure 102*b* is P2, an optimum pressure P inside the retention chamber 4 during the coating treatment is expressed by $$P=SP-(SP-EP)\times(S\pi r^2).$$

This function is an S-shaped curve function indicating the relationship between the position on the substrate W and the proportion of the coated area S in the surface area of the substrate W, and is beforehand stored in the storage unit 102 as the optimum hold pressure function 102*c*.

The coating control unit 101*b* decides the pressure inside the retention chamber 4 at each scanning position using the start-time pressure 102*a*, the end-time pressure 102*b*, and the optimum hold pressure function 102*c* and controls the pressure regulation unit 110 so that the pressure inside the retention chamber 4 becomes the above-described decided pressure.

As a result, the pressure inside the retention chamber 4 changes along the S-shaped curve linking the start-time pressure 102*a* (P1 illustrated in FIG. 6) and the end-time pressure 102*b* (P2 illustrated in FIG. 6) as illustrated in FIG. 6. Thus, the pressure inside the retention chamber 4 is regulated at the optimum pressure.

As described above, the coating apparatus 1 according to this embodiment can keep the pressure inside the retention chamber 4 at the optimum pressure by controlling the pressure difference between the start-time pressure 102*a* and the end-time pressure 102*b* according to the proportion of the coated area, and thereby can increase the film thickness uniformity.

Figure 7:
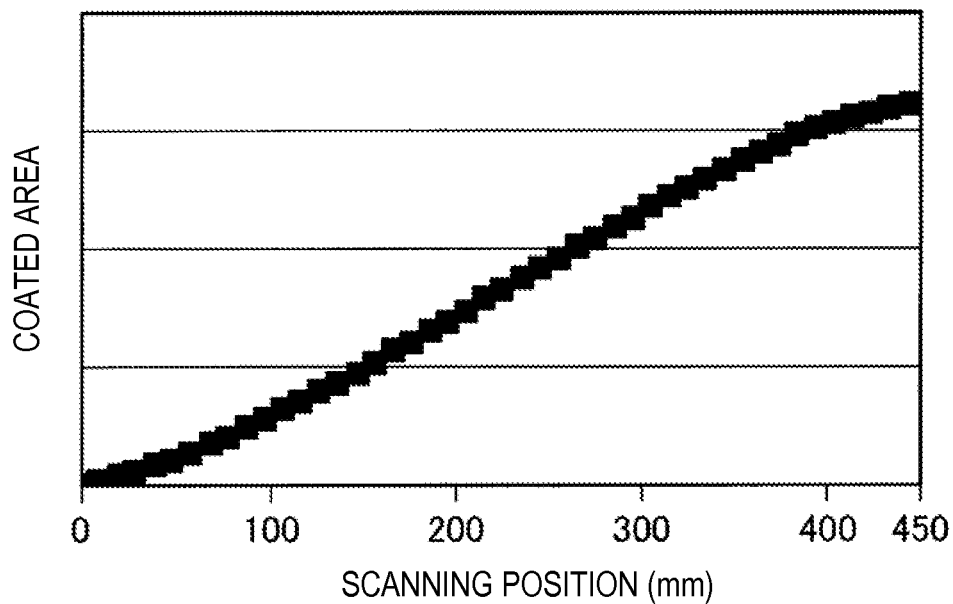
FIG. 7 is a graph indicating the relationship between the scanning position on the substrate and the coated area.

Here, a graph indicating the relationship between the scanning position on the substrate W and the coated area is illustrated in FIG. 7. As illustrated in FIG. 7, the coated area increases along the S-shaped curve.

Figure 8:
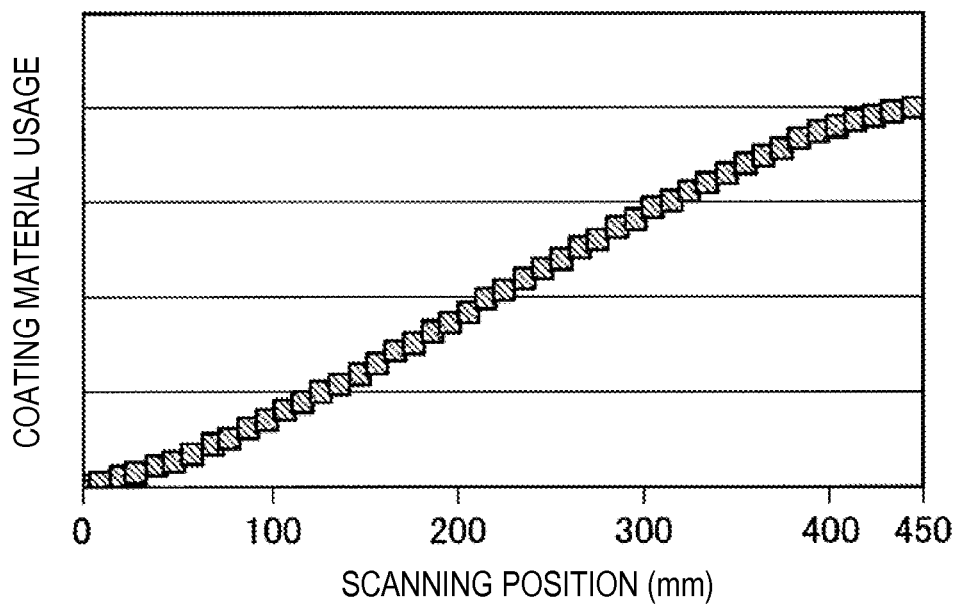
FIG. 8 is a graph indicating the relationship between the scanning position on the substrate and a usage of the coating material.

A graph indicating the relationship between the scanning position on the substrate W and the usage of the coating material R is illustrated in FIG. 8. As illustrated in FIG. 8, the usage of the coating material R also increases along the S-shaped curve and is thus found to be in a proportional relationship with the coated area illustrated in FIG. 7.

Figure 9:
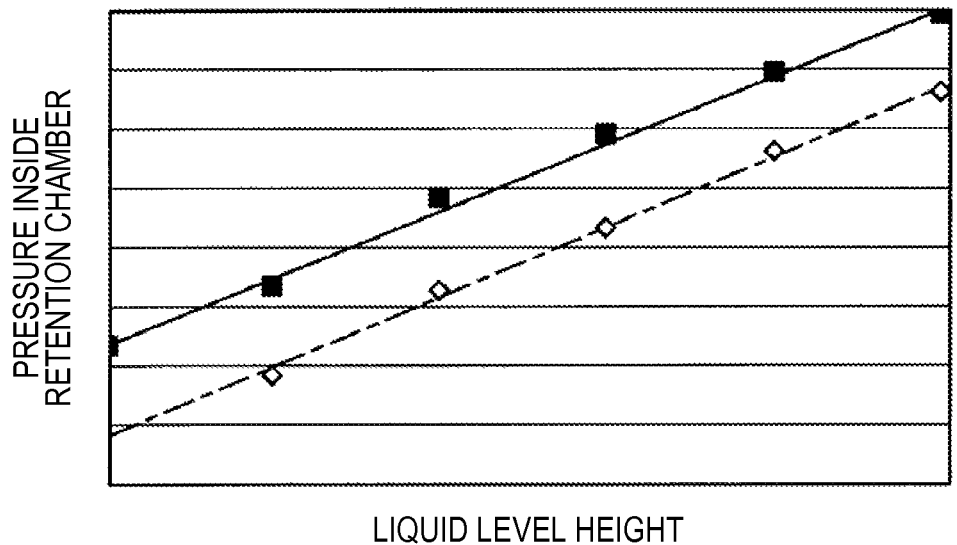
FIG. 9 is a graph indicating the relationship between a liquid level height of the coating material and the pressure inside the retention chamber.

A graph indicating the relationship between the liquid level height of the coating material R and the pressure inside the retention chamber 4 is illustrated in FIG. 9. In FIG. 9, an evaluation result when the pressure is regulated to a pressure at which the drawing of the coating material R into the retention chamber 4 is started (namely, an upper limit value of the pressure inside the retention chamber 4) is indicated by a solid line, and an evaluation result when the pressure is regulated to a pressure at which the coating material R is slightly exposed from the discharge port 6 (namely, a lower limit value of the pressure inside the retention unit 4) is indicated by a chain line. These results show that the liquid level height of the coating material R and the pressure inside the retention chamber 4 are in a proportional relationship.

The liquid level height of the coating material R decreases in inverse proportion to the coating material usage illustrated in FIG. 8. Further, as illustrated in FIG. 9, the liquid level height of the coating material R and the pressure inside the retention chamber 4 are in a proportional relationship. Accordingly, the pressure inside the retention chamber 4 can be kept at the optimum pressure by controlling the pressure inside the retention chamber 4 according to the proportion of the coated area as in the coating apparatus 1 according to this embodiment.

Returning to FIG. 4, explanation of the configuration of the control apparatus 100 is continued. The abnormality handling processing unit 101c included in the control unit 101 is a processing unit that performs predetermined abnormality handling processing when an abnormality of the coating treatment is detected based on the liquid level height of the coating material R acquired from the liquid level height measurement unit 36 and the optimum usage information 102d stored in the storage unit 102. The optimum usage information 102d is information indicating an optimum usage of the coating material R at each scanning position and, concretely, information corresponding to the graph illustrated in FIG. 8.

Figure 10:
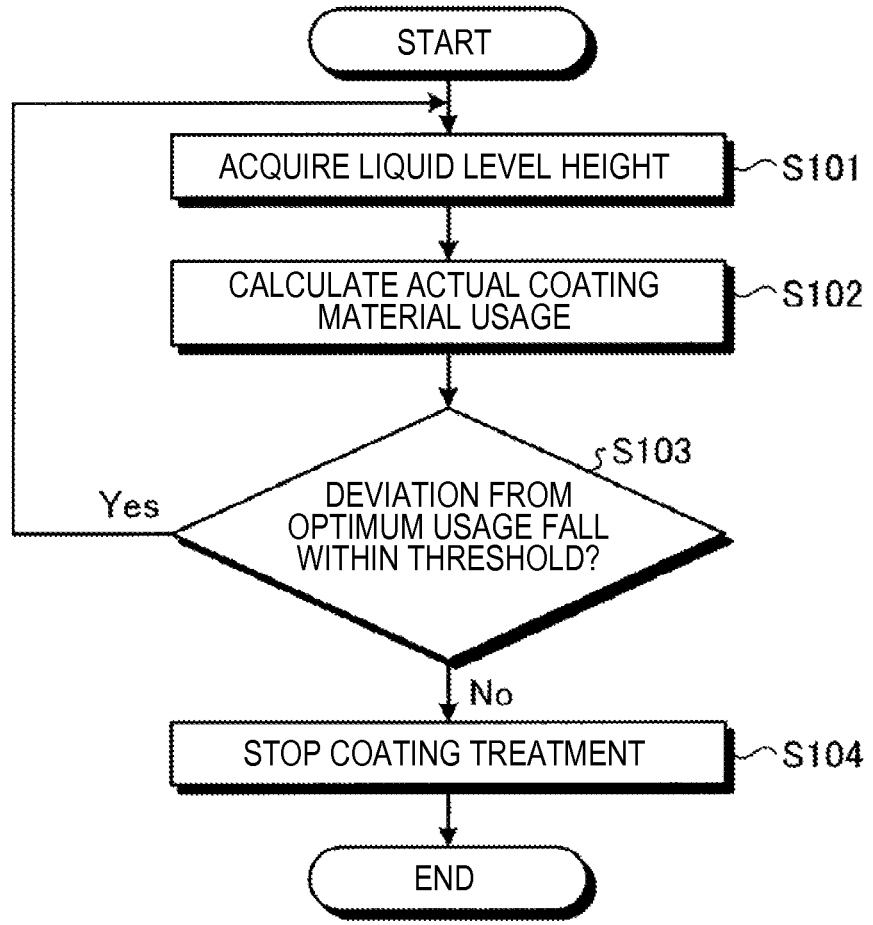
FIG. 10 is a flowchart illustrating a processing procedure of abnormality handling processing.

Here, a processing procedure of the abnormality handling processing executed by the abnormality handling processing unit 101c will be described referring to FIG. 10. FIG. 10 is a flowchart illustrating the processing procedure of the abnormality handling processing.

As illustrated in FIG. 10, the abnormality handling processing unit 101c acquires the liquid level height of the coating material R from the liquid level height measurement unit 36 (Step S101), and calculates the actual coating material usage from the acquired liquid level height (Step S102).

Subsequently, the abnormality handling processing unit 101c acquires the optimum usage information 102d from the storage unit 102, compares the actual coating material usage with the optimum usage corresponding to the current scanning position, and determines whether or not a deviation of the actual coating material usage from the optimum usage falls within a threshold (Step S103). In this processing, when the deviation from the optimum usage falls within the threshold (Step S103, Yes), namely, when the actual coating material usage falls within a normal range, the processing is returned to Step S101, and the processing at Steps S101 to S103 is repeated.

On the other hand, when the deviation of the actual coating material usage from the optimum usage exceeds the threshold (Step S103, No), the abnormality handling processing unit 101c stops the coating treatment (Step S104), and ends the processing. Concretely, the abnormality handling processing unit 101c stops the first moving mechanism 22, reports that the usage of the coating material R is abnormal or the like to a higher apparatus.

Comparing the actual coating material usage with the optimum usage stored beforehand as described above making it possible to stop the coating treatment in the case where the liquid level height changes at a rate different from that at normal time such as a case where liquid leakage occurs in the slit nozzle 30, thus preventing wasteful consumption of the coating material R.

Incidentally, the example that the control unit 101 controls the pressure regulation unit 110 so that the change in the pressure inside the retention chamber 4 in the entire zone from the coating start position p1 to the coating end position p2 becomes a change along the S-shaped curve linking the start-time pressure 102a and the end-time pressure 102b set by the setting unit 101a has been described in the above embodiment. However, the zone in which the pressure inside the retention chamber 4 is changed along the S-shaped curve does not always need to be the entire zone from the coating start position p1 to the coating end position p2.

Figure 11:
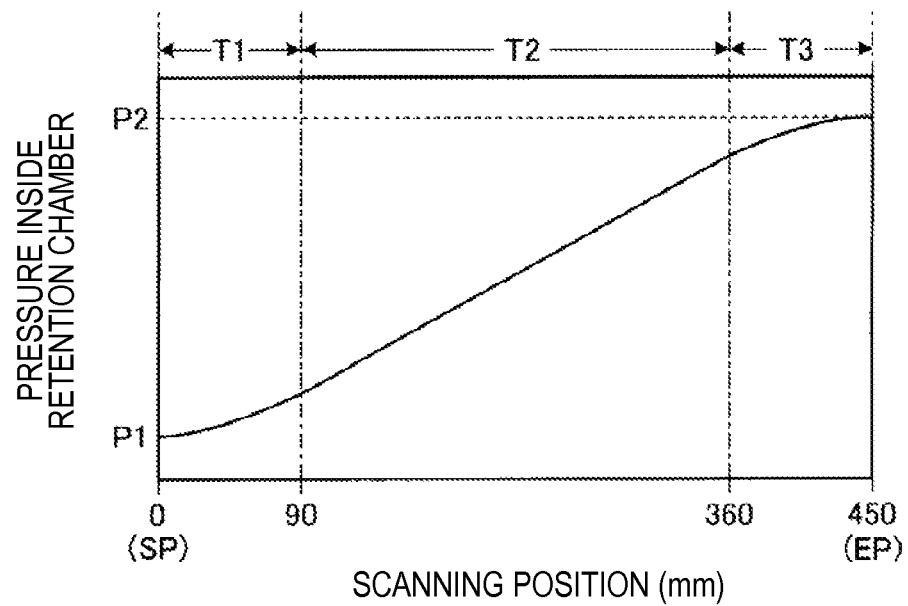
FIG. 11 is a chart illustrating another example of the relationship between the scanning position and the pressure inside the retention unit.

This point will be described referring to FIG. 11. FIG. 11 is a chart illustrating another example of the relationship between the scanning position and the pressure inside the retention unit 4.

As illustrated in FIG. 11, the coating control unit 101b included in the control unit 101 may control the pressure regulation unit 110 so that the change in the pressure inside the retention chamber 4 at least in a start zone T1 including the coating start position p1 and an end zone T3 including the coating end position p2 becomes a change along the S-shaped curve linking the start-time pressure 102a and the end-time pressure 102b.

Here, the start zone T1 is a zone having a start point at the coating start position p1 and an end point at a position closer to the coating start position p1 than is a position away from the coating start position p1 toward the coating end position p2 by a distance of ⅕ of the diameter of the substrate W. In the case of this embodiment, for example, a zone of a scanning position from 0 mm or more to less than 90 mm corresponds to the start zone T1.

Further, the end zone T3 is a zone having a start point at a position closer to the coating end position p2 than is a position away from the coating end position p2 toward the coating start position p1 by the distance of ⅕ of the diameter of the substrate W and an end point at the coating end position p2. In the case of this embodiment, for example, a zone of a scanning position from more than 360 mm to 450 mm or less corresponds to the end zone T3. Further, a zone except the start zone T1 and the end zone T3 is a middle zone T2. In the case of this embodiment, for example, a zone of a scanning position from 90 mm or more to 360 mm or less corresponds to the middle zone T2.

In the start zone T1 and the end zone T3, liquid dripping or liquid shortage of the coating material R is more likely to occur than in the middle zone T2 because the rate of change in coated area, in other words, the rate of change in the coating material usage is larger than that in the middle zone T2. Concretely, the rate of change in coated area (the coating material usage) becomes maximum at a position where an angle formed between the coating start position p1 and the coating end position p2 becomes 45°.

For example, there is a case where it is unnecessary to strictly change the pressure inside the retention chamber 4 along the S-shaped curve in the entire zone from the coating start position p1 to the coating end position p2 depending on the viscosity of the chemical, the size of the substrate W or the like. In this case, the pressure inside the retention chamber 4 may be changed along the S-shaped curve at least in the start zone T1 and the end zone T3 where liquid dripping or liquid shortage of the coating material R is likely to occur.

Figure 12:
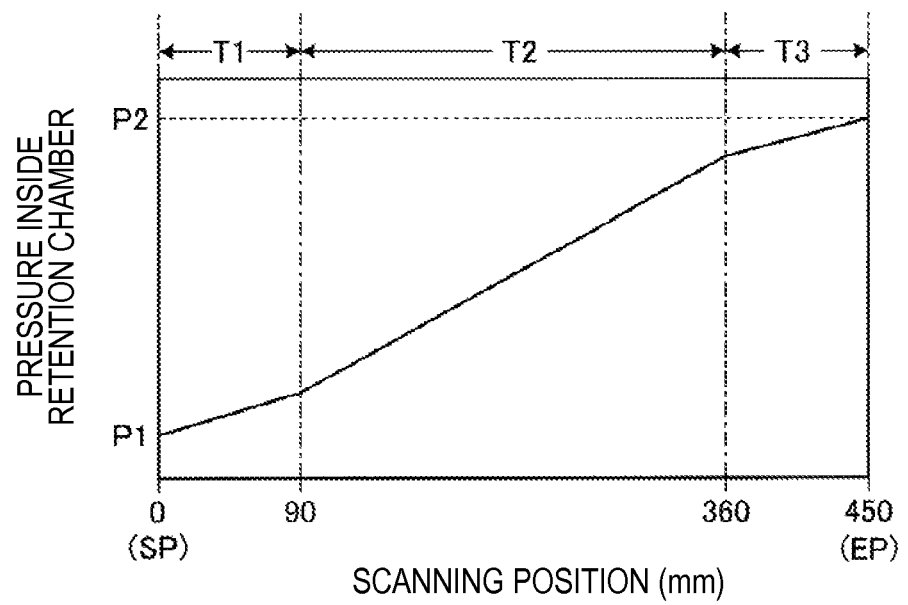
FIG. 12 is a chart illustrating another example of the relationship between the scanning position and the pressure inside the retention unit.

Further, there is a case where it is unnecessary to strictly change the pressure inside the retention chamber 4 along the S-shaped curve also in the start zone T1 and the end zone T3 depending on the viscosity of the chemical, the size of the substrate W or the like. An example of the pressure control in the case will be described referring to FIG. 12. FIG. 12 is a chart illustrating another example of the relationship between the scanning position and the pressure inside the retention unit 4.

As illustrated in FIG. 12, the coating control unit 101b may linearly change the pressure inside the retention chamber 4 in all of the start zone T1, the middle zone T2, and the end zone T3. In this case, the coating control unit 101b only needs to control the pressure regulation unit 110 so that the change in the pressure inside the retention chamber 4 in the start zone T1 and the end zone T3 becomes slower than the change in the pressure inside the retention chamber 4 in the middle zone T2.

As has been described above, the coating apparatus 1 according to this embodiment includes the slit nozzle 30, the first moving mechanism 22, the pressure regulation unit 110, and the control unit 101. The slit nozzle 30 includes the retention chamber 4 that retains the coating material R. The first moving mechanism 22 relatively moves the slit nozzle 30 with respect to the substrate W. The pressure regulation unit 110 regulates the pressure inside the retention chamber 4. The control unit 101 controls the first moving mechanism 22 and the pressure regulation unit 110 to relatively move the slit nozzle 30 with respect to the substrate W while changing the pressure inside the retention chamber 4 toward the atmospheric pressure from the negative pressure. Further, the control unit 101 controls the pressure regulation unit 110 so that the change in the pressure inside the retention chamber 4 in the start zone T1 including the coating start position p1 and the end zone T3 including the coating end position p2 becomes slower than the change in the pressure inside the retention chamber 4 in the middle zone T2 except the start zone T1 and the end zone T3.

Therefore, with the coating apparatus 1 according to this embodiment, the film thickness uniformity can be increased.

Further effects and modifications can be easily derived by hose skilled in the art. Therefore, wide-ranging aspects of the present invention are not limited by the specific details and the representative embodiment expressed and described as above. Accordingly, it is possible to make various changes and modifications without departing from the spirit and scope of the comprehensive concept of the invention defined by the accompanying claims and equivalents thereof.

What is claimed is:

1. A coating apparatus for applying a coating material to a substrate, comprising:
 a slit nozzle comprising a retention chamber that retains the coating material;
 a moving mechanism that relatively moves the slit nozzle with respect to the substrate, the retention chamber is adapted to contain a volume of the coating material that decreases throughout application of the coating material;
 a pressure regulation unit that regulates a pressure inside the retention chamber; and
 a control unit that is configured to control the moving mechanism and the pressure regulation unit to relatively move the slit nozzle evenly in a moving direction to scan with respect to the substrate in the moving direction from a coating start position on the substrate through a middle zone to a coating end position on the substrate while constantly increasing the pressure inside the retention chamber toward an atmospheric pressure from a negative pressure,
 wherein an entire coating length of the substrate consists of three zones which are a start zone, the middle zone, and an end zone;
 wherein the control unit is further configured to control the pressure regulation unit so that a change in the pressure inside the retention chamber while the slit nozzle is relatively moved in the moving direction throughout the start zone which includes the coating start position and throughout the end zone which includes the coating end position becomes slower than a change in the pressure inside the retention chamber while the slit nozzle is relatively moved in the moving direction throughout the middle zone, and to control the pressure regulation unit so that the pressure inside the retention chamber at the coating start position starts with a fixed pressure and the pressure inside the retention chamber is constantly increased while the slit nozzle is moved from the coating start position to the coating end position,
 a slope is defined as pressure inside the retention chamber vs distance moved in the moving direction, the slope correspondingly to the middle zone is different than the slope corresponding to the start zone and the end zone; and the slope corresponding to the start zone and the slope corresponding to the end zone are less than the slope corresponding to the middle zone,
 the start zone has a first predetermined length in the moving direction from the coating start position to an end point of the start zone, the end point of the start zone is closer than the coating start position to the end zone, the end zone has a second predetermined length in the moving direction from a start point of the end zone to the coating end position, the start point of the end zone is closer than the coating end position to the start zone, the middle zone is from the end point of the start zone to the start point of the end zone,
 the coating start position of the start zone is a first end of the circular substrate,
 the coating end position of the end zone is a second end of the circular substrate opposite to the first end,
 the start zone, the middle zone, and the end zone cover the entire diameter of the circular substrate.

2. The coating apparatus according to claim 1,
 wherein the control unit comprises a setting unit that sets a start-time pressure being a pressure inside the retention chamber at the coating start position and an end-time pressure being a pressure inside the retention chamber at the coating end position, and is configured to control the pressure regulation unit so that the change in the pressure inside the retention chamber at least in the start zone and the end zone becomes a change along an S-shaped curve linking the start-time pressure and the end-time pressure set by the setting unit.

3. The coating apparatus according to claim 2,
 wherein the control unit is configured to control the pressure regulation unit so that the change in the pressure inside the retention chamber in an entire zone from the coating start position to the coating end position becomes a change along the S-shaped curve linking the start-time pressure and the end-time pressure set by the setting unit.

4. The coating apparatus according to claim 2,
wherein the control unit is configured to decide the S-shaped curve linking the start-time pressure and the end-time pressure on a basis of an S-shaped curve function indicating a relationship between a position on the substrate and a proportion of a coated area in a surface area of the substrate.

5. The coating apparatus according to claim 3,
wherein the control unit is configured to decide the S-shaped curve linking the start-time pressure and the end-time pressure on a basis of an S-shaped curve function indicating a relationship between a position on the substrate and a proportion of a coated area in a surface area of the substrate.

6. The coating apparatus according to claim 1,
wherein the start zone has the end point at a position closer to the coating start position than is a position away from the coating start position toward the coating end position by a distance of ⅕ of a diameter of the substrate, and
wherein the end zone has the start point at a position closer to the coating end position than is a position away from the coating end position toward the coating start position by a distance of ⅕ of the diameter of the substrate.

7. The coating apparatus according to claim 2,
wherein the start zone has the end point at a position closer to the coating start position than is a position away from the coating start position toward the coating end position by a distance of ⅕ of a diameter of the substrate, and
wherein the end zone has the start point at a position closer to the coating end position than is a position away from the coating end position toward the coating start position by a distance of ⅕ of the diameter of the substrate.

8. The coating apparatus according to claim 3,
wherein the start zone has the end point at a position closer to the coating start position than is a position away from the coating start position toward the coating end position by a distance of ⅕ of a diameter of the substrate, and
wherein the end zone has the start point at a position closer to the coating end position than is a position away from the coating end position toward the coating start position by a distance of ⅕ of the diameter of the substrate.

9. The coating apparatus according to claim 4,
wherein the start zone has the end point at a position closer to the coating start position than is a position away from the coating start position toward the coating end position by a distance of ⅕ of a diameter of the substrate, and
wherein the end zone has the start point at a position closer to the coating end position than is a position away from the coating end position toward the coating start position by a distance of ⅕ of the diameter of the substrate.

10. The coating apparatus according to claim 5,
wherein the start zone has the end point at a position closer to the coating start position than is a position away from the coating start position toward the coating end position by a distance of ⅕ of a diameter of the substrate, and
wherein the end zone has the start point at a position closer to the coating end position than is a position away from the coating end position toward the coating start position by a distance of ⅕ of the diameter of the substrate.

\* \* \* \* \*